(12) United States Patent
Henrie

(10) Patent No.: US 8,325,098 B1
(45) Date of Patent: Dec. 4, 2012

(54) DYNAMIC ANTENNA PATTERN MEASUREMENT METHOD

(75) Inventor: Justin Henrie, Camarillo, CA (US)

(73) Assignee: United States of America as Represented by the Secretary of the Navy, Washington, DC (US)

( * ) Notice: Subject to any disclaimer, the term of this patent is extended or adjusted under 35 U.S.C. 154(b) by 401 days.

(21) Appl. No.: 12/770,311

(22) Filed: Apr. 29, 2010

(51) Int. Cl.
    *G01R 29/10* (2006.01)
    *G01R 27/04* (2006.01)

(52) U.S. Cl. ........ 343/703; 343/760; 343/794; 324/632; 324/637; 455/67.11; 455/67.14

(58) Field of Classification Search ................ 343/703, 343/760, 794; 324/632, 637; 455/67.11, 455/67.14
See application file for complete search history.

(56) References Cited

U.S. PATENT DOCUMENTS

| 6,249,248 B1 * | 6/2001 | Kitayoshi | 342/360 |
| 6,285,330 B1 * | 9/2001 | Perl | 343/703 |
| 7,994,991 B2 * | 8/2011 | Grange et al. | 343/703 |
| 2008/0094295 A1 * | 4/2008 | Hess et al. | 343/703 |

* cited by examiner

*Primary Examiner* — Dieu H Duong
(74) *Attorney, Agent, or Firm* — Christopher L. Blackburn

(57) ABSTRACT

A dynamic antenna pattern measurement method. Embodiments of the invention provide for nanosecond or better time resolution and milliradian angular resolution of the dynamic radiation pattern of an antenna under test over the predetermined solid angle scan (up to $4\pi$ steradians) of the dynamic radiation pattern.

10 Claims, 4 Drawing Sheets

DYNAMIC ANTENNA PATTERN MEASUREMENT METHOD

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to antenna pattern measurement methods.

It is to be understood that the foregoing and the following detailed description are exemplary and explanatory only and are not to be viewed as being restrictive of the invention, as claimed. Advantages of this invention will be apparent after a review of the following detailed description of the disclosed embodiments, which are illustrated schematically in the accompanying drawings and in the appended claims.

DETAILED DESCRIPTION OF THE EMBODIMENTS OF THE INVENTION

Figure 2A:
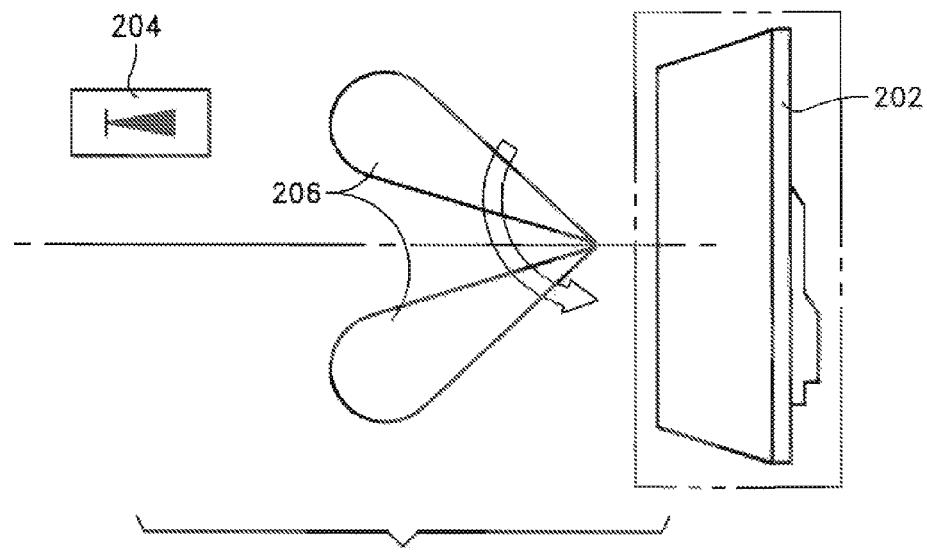
FIG. 2A depicts a probe antenna in an orientation in relation to an antenna under test in accordance with principles of the invention.
Figure 2B:
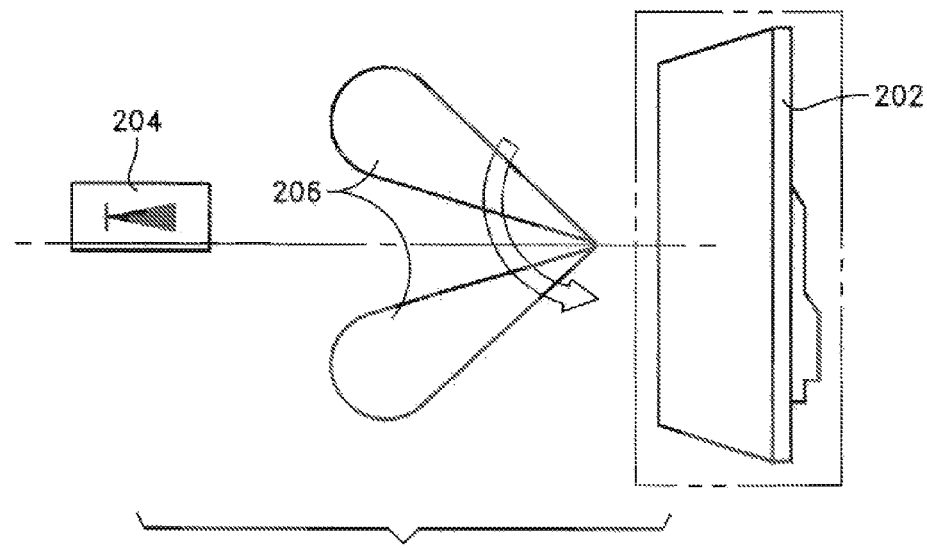
FIG. 2B depicts a probe antenna in an orientation in relation to an antenna under test in accordance with principles of the invention.
Figure 2C:
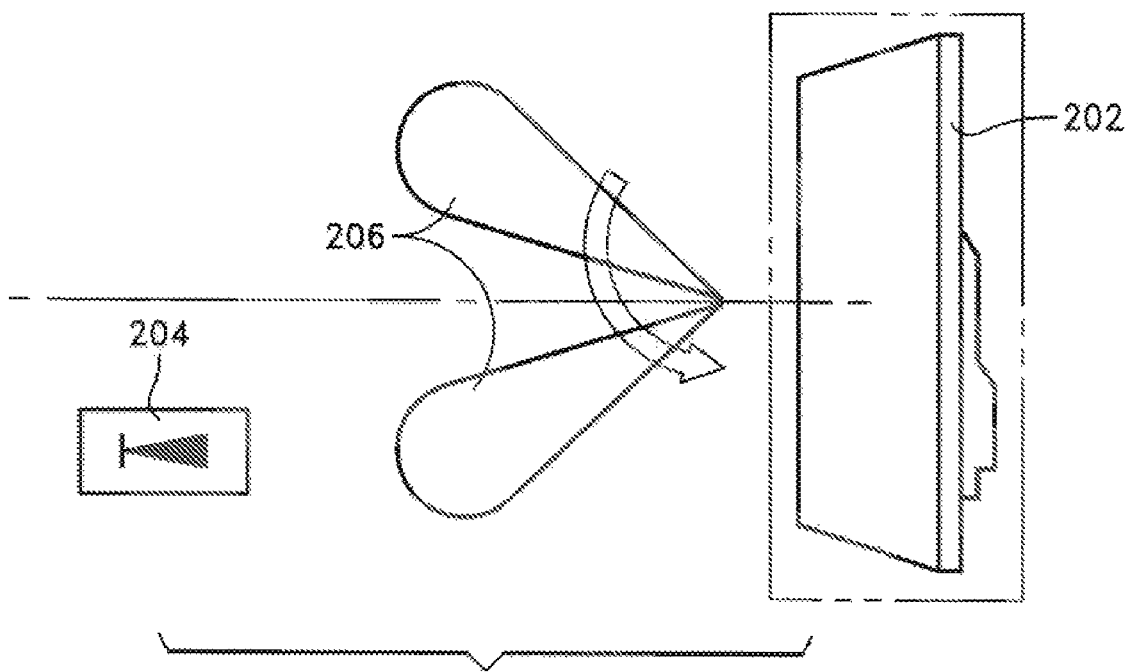
FIG. 2C depicts a probe antenna in an orientation in relation to an antenna under test in accordance with principles of the invention.

Embodiments of the invention generally relate to a dynamic antenna pattern measurement method. Embodiments of the invention provide for nanosecond or better time resolution and milliradian angular resolution of the dynamic radiation pattern of an antenna under test 202 (FIGS. 2A-C) over a predetermined solid angle scan (up to $4\pi$ steradians) of the dynamic radiation pattern. The method provides for a direct measurement of the dynamic radiation of an antenna, and does not suffer the limiting simplifications of linearity, grid resolution, material properties, physical mechanisms, and geometry which are inherent in time-domain electromagnetic simulation packages such as Remcon's XFDTD and CST Microwave Studio.

An embodiment of a dynamic antenna pattern measurement method performed in accordance with the principles of the invention includes: placing a dynamic antenna under test in an antenna measurement facility, the antenna measurement facility having a positioner; programming the dynamic antenna under test with a commutation (beamsteering) sequence to be measured; programming the positioner with a predetermined solid angle scan; transmitting the commutation sequence from the dynamic antenna under test with a probe antenna in an initial position; using the probe antenna to record the full time-domain waveform received by the probe antenna; moving the positioner to the next sequence in the solid angle scan; re-playing the dynamic antenna under test's commutation sequence; recording the full time-domain waveform received by the probe antenna; iterating through the moving the positioner to the next sequence in the predetermined solid angle scan, re-playing the dynamic antenna under test's commutation sequence, and recording the full time-domain waveform received by the probe antenna, steps until the entire predetermined solid angle scan is completed; time-correlating and spatially arraying the waveforms recorded at each position of the probe antenna relative to the dynamic antenna under test; and electronically recovering the full angular and temporal information of one output commutation sequence's radiation from the recorded full time-domain waveforms, resulting in a solid-angle measurement of the dynamic antenna under test's commutation sequence providing for nanosecond or better time resolution and milliradian angular resolution over the predetermined solid angle scan of the dynamic radiation pattern of the dynamic antenna under test.

Figure 1A:
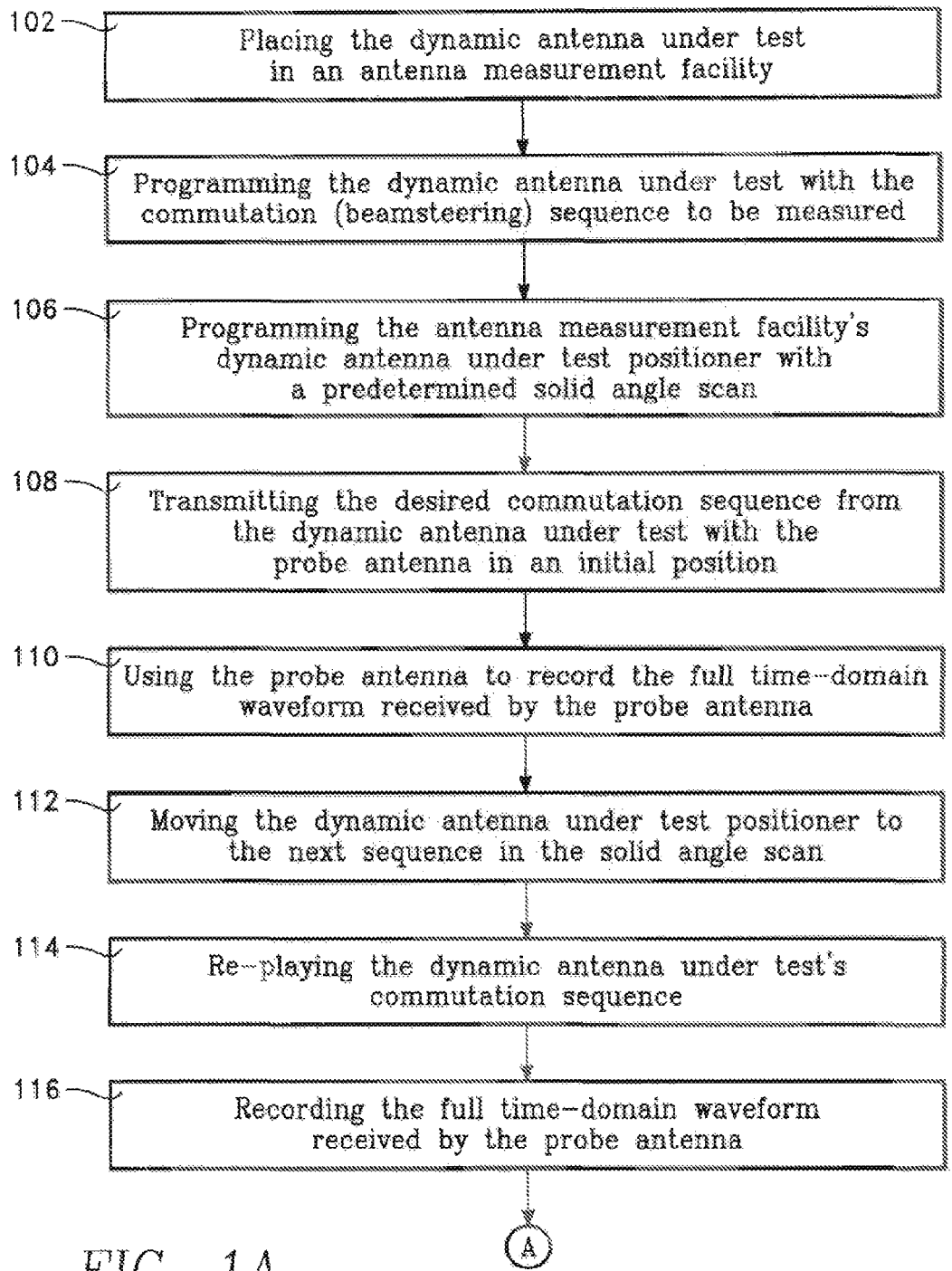
FIGS. 1A and 1B form a flowchart describing an embodiment of a method performed in accordance with the principles of the invention.

A dynamic antenna under test 202 is placed in an antenna measurement facility 102 (FIG. 1A). A dynamic antenna under test 202 (FIGS. 2A-C) is a dynamic antenna that is tested using a process in accordance with the principles of this invention. A dynamic antenna is any antenna capable of changing its radiation characteristics (e.g., directionality, gain) by electronic means. A popular example of a dynamic antenna is a phased array antenna. The antenna measurement facility includes a probe antenna 204 and can be any facility that has antenna positioning hardware and a digitizing receiver attached to the probe antenna 204.

The probe antenna 204 is any antenna whose received radiation pattern characteristics are known and are suitable to antenna measurement testing. The bandwidth of the probe antenna's 204 receiver should be greater than or equal to the bandwidth of the modulation of the antenna under test's 202 output radiation 206.

The dynamic antenna under test 202 is programmed with the commutation (beamsteering) sequence to be measured 104 (FIG. 1A). Any sequence can be used, subject to the facility's power handling capabilities, receiver bandwith, and wide-angle radiation measurement capability. There is no inherent limitation to the angular, bandwidth, amplitude, or frequency range of the commutation sequence due to the proposed measurement method (though limitations may be imposed by the capabilities of the hardware used to implement the method).

The antenna measurement facility's positioner ("positioner") is programmed with the desired solid angle scan 106. The positioner is used to position the dynamic antenna under test 202 (FIGS. 2A-C) at certain positions relative to the probe antenna 204, or vice versa. The desired solid angle scan can be any shape, including, for example, spherical, planar, and cylindrical, and can be any extent, including, for example, full sphere or half sphere.

With the positioner in an initial position, the desired commutation sequence is transmitted from the dynamic antenna under test 202 (step 108 in FIG. 1A). The probe antenna 204 (FIGS. 2A-C) measures the radiation output by the antenna under test 202.

The probe antenna 204 is used to record the full time-domain waveform ("waveform") received by the probe antenna 204 on any known form of digital media ("digital media" including, for example, computer memory) 110 (FIG. 1A).

The positioner is then moved to the next sequence in the solid angle scan 112.

The dynamic antenna under test's 202 (FIGS. 2A-C) commutation sequence is re-played 114 (FIG. 1A).

The full time-domain waveform ("waveform") received by the probe antenna 204 (FIGS. 2A-C) is again recorded on any form of digital media 116 (FIG. 1A).

Figure 1B:
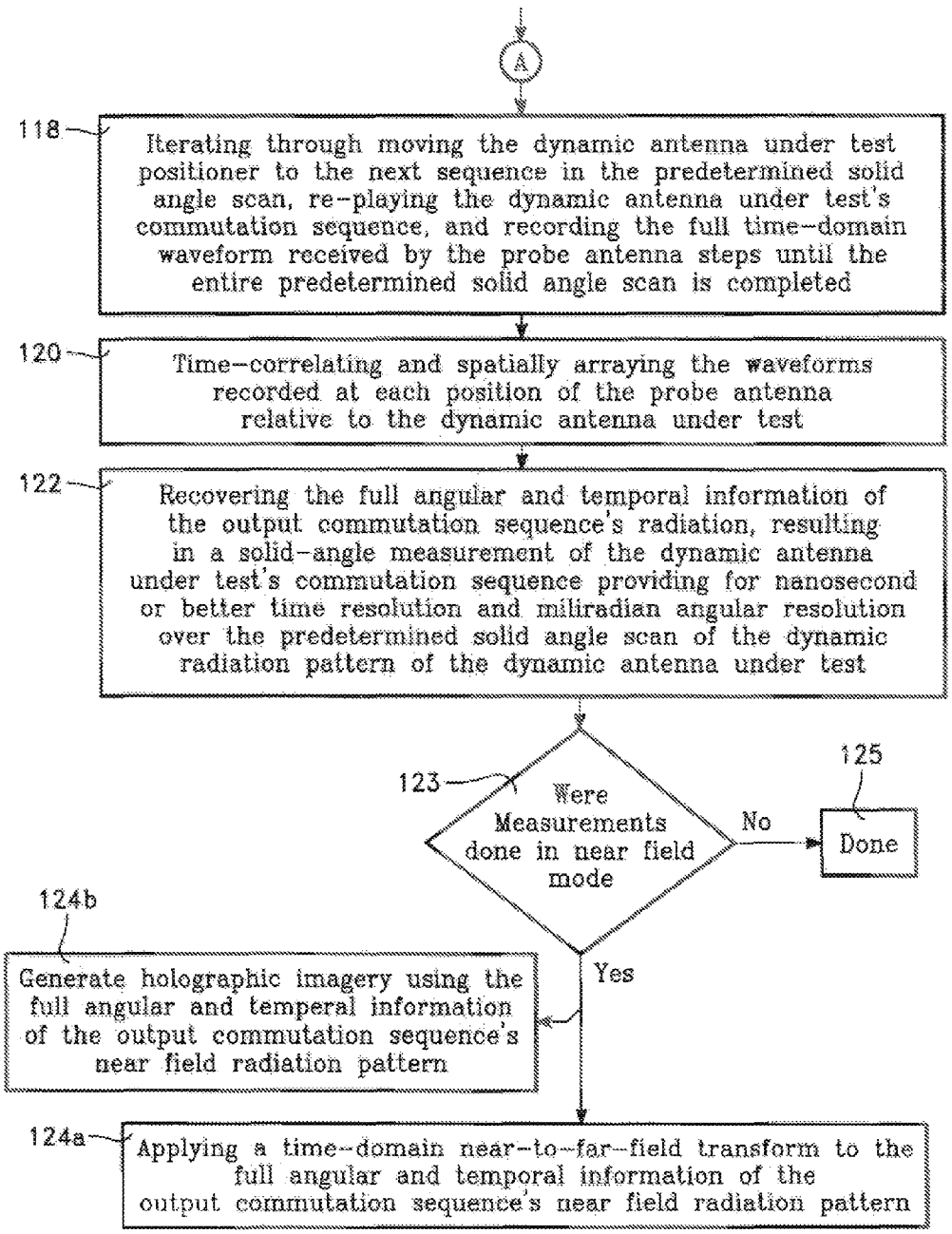

With reference to FIG. 1B, step 118, the following steps are iterated until the entire solid angle scan desired is completed, i.e., the receiver has stepped through the entire spatial area of interest: 1) moving the positioner to the next sequence in the solid angle scan 112 (FIG. 1A); 2) re-playing the dynamic antenna under test's 202 (FIGS. 2A-C) commutation sequence 114 (FIG. 1A); and 3) recording the full time-domain waveform received by the probe antenna 204 (FIGS. 2A-C) (FIG. 1A, 116).

The full time-domain waveforms recorded at each position of the probe antenna 204 (FIGS. 2A-C) relative to the dynamic antenna under test 202 are time-correlated (meaning all are time-referenced to a common starting point such as the beginning of the repeated commutation sequence) and spatially-correlated (meaning the individual measurements are distinguished by their measurement position, or the position of the probe antenna at the time of measurement) using any known means 120 (FIG. 1B).

The recorded full time-domain waveforms are electronically processed to provide the full angular and temporal information of one output commutation sequence's radiation pattern, resulting in a solid-angle measurement of the dynamic antenna under test's 202 (FIGS. 2A-C) commutation sequence, providing for user determined time resolution (including, but not limited to, nanosecond or better time resolution) and angular resolution (including, but not limited to, milliradian angular resolution) over the predetermined solid angle scan of the dynamic radiation pattern of the dynamic antenna under test 202 (FIGS. 2A-C), 122 (FIG. 1B).

With reference to FIG. 1B decision block 123, in one embodiment, when the measurements were taken/recorded (performed) in near field mode, a time-domain near-to-far-field transform to the full angular and temporal information of the output commutation sequence's near-field radiation pattern is applied using any time domain near-to-far-field transform (or any other known means) 124*a*.

In another embodiment, with reference to FIG. 1B decision block 123, when the measurements (waveforms) were taken/recorded in near-field mode, holographic imagery of the radiating field at the surface of the antenna under test is created using the full angular and temporal information of the output commutation sequence's near-field radiation pattern 124*b* using any known microwave holographic metrology means. Microwave holographic metrology involves transformation of the full angular and temporal information of the output commutation sequence's near-field radiation pattern to a representation/approximation of measurements at closer approaches to the antenna under test ("back-transformation"). The use of the back transformation has its greatest application in the phase alignment of phased-array antennas. The amplitude and phase of each element of a phased array can be determined accurately and is used to adjust the phase of the element, and to detect defective elements or phase shifters. Element phase accuracy of one degree RMS (root mean squared) is being achieved on large microwave radar antennas. Other uses include the detection of anomalies in radomes and in detection of surface distortion in parabolic reflector antennas.

When the measurements are not taken/recorded in near field mode, the method is complete 125.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A dynamic antenna pattern measurement method comprising:
    placing a dynamic antenna under test in an antenna measurement facility, said antenna measurement facility having a positioner;
    programming said dynamic antenna under test with a commutation (beamsteering) sequence to be measured;
    programming said positioner with a predetermined solid angle scan;
    transmitting said commutation sequence from said dynamic antenna under test with a probe antenna in an initial position;
    using said probe antenna to record the full time-domain waveform received by said probe antenna;
    moving said positioner to the next sequence in the solid angle scan;
    re-playing said dynamic antenna under test's commutation sequence;
    recording the full time-domain waveform received by said probe antenna;
    iterating through said moving said positioner to the next sequence in said predetermined solid angle scan, re-playing said dynamic antenna under test's commutation sequence, and recording the full time-domain waveform received by said probe antenna, steps until the entire predetermined solid angle scan is completed;
    time-correlating and spatially arraying the waveforms recorded at each position of said probe antenna relative to said dynamic antenna under test; and
    electronically recovering the full angular and temporal information of one output commutation sequence's radiation from the recorded full time-domain waveforms, resulting in a solid-angle measurement of said dynamic antenna under test's commutation sequence providing for nanosecond or better time resolution and miliradian angular resolution over the predetermined solid angle scan of the dynamic radiation pattern of said dynamic antenna under test.

2. The dynamic antenna pattern measurement method of claim 1 further comprising:
    applying a time-domain near-to-far-field transform to the full angular and temporal information of said one instance of said output commutation sequence's radiation.

3. The dynamic antenna pattern measurement method of claim 1 wherein:
    said predetermined solid angle scan is spherical.

4. The dynamic antenna pattern measurement method of claim 1 wherein:
    said predetermined solid angle scan extends over the full sphere of 4π steradians.

5. The dynamic antenna pattern measurement method of claim 1 wherein:
    said predetermined solid angle scan is cylindrical.

6. The dynamic antenna pattern measurement method of claim 1 wherein:
    said predetermined solid angle scan is planar.

7. The dynamic antenna pattern measurement method of claim 1 wherein:
    said method is performed in near-field mode; and
    said recorded full angular and temporal information of said output commutation sequence's radiation pattern comprises a full angular and temporal information of the output commutation sequence's near-field radiation pattern.

8. The dynamic antenna pattern measurement method of claim 7 further comprising:

applying a time-domain near-to-far-field transform to said full angular and temporal information of the output commutation sequence's near-field radiation pattern.

9. The dynamic antenna pattern measurement method of claim 7 further comprising:

generating holographic imagery using said full angular and temporal information of the output commutation sequence's near-field radiation pattern.

10. The dynamic antenna pattern measurement method of claim 9 wherein said generating holographic imagery using said near-field waveform data comprises:

back transforming said full angular and temporal information of the output commutation sequence's near-field radiation pattern.

\* \* \* \* \*